(12) United States Patent
Barrault et al.

(10) Patent No.: US 7,459,901 B2
(45) Date of Patent: Dec. 2, 2008

(54) VOLTAGE PRESENCE INDICATION DEVICE AND ELECTRICAL APPARATUS COMPRISING SUCH AN INDICATOR

(75) Inventors: Michel Barrault, Mens (FR); Vincent Minier, Claix (FR); Agnès Arnaud, Grenoble (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 578 days.

(21) Appl. No.: 10/488,896

(22) PCT Filed: Sep. 4, 2002

(86) PCT No.: PCT/FR02/03005

§ 371 (c)(1), (2), (4) Date: Mar. 8, 2004

(87) PCT Pub. No.: WO03/025591

PCT Pub. Date: Mar. 27, 2003

(65) Prior Publication Data

US 2004/0239306 A1 Dec. 2, 2004

(30) Foreign Application Priority Data

Sep. 14, 2001 (FR) .................................. 01 11940

(51) Int. Cl.
*G01R 19/55* (2006.01)
*H05B 33/00* (2006.01)

(52) U.S. Cl. ....................... 324/133; 313/506

(58) Field of Classification Search ............... 324/72.5, 324/133; 313/498–512; 315/169.3; 345/36, 345/45, 76

See application file for complete search history.

(56) References Cited

U.S. PATENT DOCUMENTS

| 3,002,121 | A | | 9/1961 | Bramley et al. ............. 313/108 |
|---|---|---|---|---|
| 3,039,013 | A | | 6/1962 | Wilmotte .................... 313/108 |
| 3,680,071 | A | * | 7/1972 | Burgoon ...................... 340/654 |
| 3,744,045 | A | * | 7/1973 | Frink et al. .................. 340/654 |
| 3,970,932 | A | * | 7/1976 | Harvey ........................ 324/133 |
| 4,143,297 | A | * | 3/1979 | Fischer ....................... 313/502 |
| 4,152,643 | A | * | 5/1979 | Schweitzer, Jr. ............. 324/120 |
| 4,213,074 | A | * | 7/1980 | Kawaguchi et al. ......... 313/509 |
| 4,482,892 | A | * | 11/1984 | Farag et al. ................. 340/654 |
| 4,987,339 | A | * | 1/1991 | Robertson ................... 313/502 |
| 5,051,733 | A | * | 9/1991 | Neuhouser .................. 340/660 |
| 5,220,183 | A | * | 6/1993 | Taniguchi et al. ............. 257/88 |

FOREIGN PATENT DOCUMENTS

EP 0 109 914 A 5/1984

* cited by examiner

*Primary Examiner*—Nimeshkumar D. Patel
(74) *Attorney, Agent, or Firm*—Steptoe & Johnson LLP

(57) ABSTRACT

The voltage presence indication device comprises a collector electrode (2) designed to have at least one capacitive connection (5) with an electrical ground (6) or a capacitive connection (3) with an electrical conductor (4) to be monitored, and display means (7) connected to said collector electrode (2) to indicate the presence of an electrical voltage in said electrical conductor to be monitored. The display means comprise at least one multilayer device (11). The multilayer device comprises a light-emitting layer (12) arranged between a first insulating layer (13) and a second insulating layer (14), a first conducting layer (15) arranged on the first insulating layer (13) and connected to said conducting electrode (2), and a second conducting layer (16) arranged on the second insulating layer (14). An electrical apparatus comprises such a device.

18 Claims, 7 Drawing Sheets

VOLTAGE PRESENCE INDICATION DEVICE AND ELECTRICAL APPARATUS COMPRISING SUCH AN INDICATOR

BACKGROUND OF THE INVENTION

The invention relates to a voltage presence indication device comprising:
- a collector electrode designed to have at least one capacitive connection with an electrical ground or a capacitive connection with an electrical conductor to be monitored, and
- display means connected to said collector electrode to indicate the presence of an electrical voltage in said electrical conductor to be monitored.

The invention also relates to an electrical apparatus comprising an electrical conductor and such a voltage presence indication device.

STATE OF THE ART

Voltage presence indication devices exist using various display means to indicate the presence of an electrical voltage. Some are based on the use of a neon lamp or a discharge tube connected to a capacitive divider formed by floating electrodes or electrical components. Such devices are described in the Patents U.S. Pat. Nos. 3,991,367, 4,251,770, and in the Patent applications FR 2,689,248 and EP 0,109,914. These lamp-based devices have the drawback of having a limited lifetime. Their lifetime is generally less than 50,000 hours.

A diagram of a neon lamp-based device is represented in FIG. 1. In this diagram, a voltage presence indication device 1 comprises a collector electrode 2 having a first capacitive connection 3 with a conductor 4 to be monitored and a second capacitive connection 5 with an electrical ground 6. The electrode 2 is connected to display means 7 comprising an electronic circuit 8 to command lighting of a neon indicator lamp 9 when an electrical voltage is present on the electrical conductor 4. In this case, for example, the electronic circuit is connected to the potential of the conductor 4.

Other LED-based devices have a longer lifetime. A device of this type is described in the Patent EP 0,402,277 B1. In this device, a complex electronic circuit is required to rectify the current and command the diode with a preset threshold. Furthermore, as the operating current is high, the floating electrodes or the capacitors of the capacitive divider have large dimensions.

A diagram of a light-emitting diode-based device is represented in FIG. 2. In this diagram, the electrode 2 is connected to the electronic circuit 8 to command lighting of a light-emitting diode 10 when an electrical voltage is present on the electrical conductor 4. In this case, for example, the electronic circuit is connected to the potential of the electrical ground 6.

In other devices, the display means are liquid crystal indicators. Such devices are described in the Patents U.S. Pat. Nos. 5,274,324, 5,070,201, and 5,077,520. These devices require little electrical power supplied by the capacitive divider, however they do have the shortcoming of not radiating or emitting light. Thus, to display with such devices, it is necessary to have an auxiliary light source which lights the liquid crystals either from the front by reflection or from the rear with a light passing through the crystals. Another drawback of liquid crystals concerns their temperature resistance which is generally not very high.

State-of-the-art devices generally operate in high voltage or medium voltage. When they are medium voltage, the floating or collector electrode must be of very large size to supply enough energy to the display device. Some devices use components such as capacitors arranged in insulators to perform the capacitive divider function. Moreover, in most devices an electronic circuit is required to match the voltage supplied by the capacitive divider to the display means. The cost of state-of-the-art voltage presence indication devices is thus very high. This high cost is very sensitive for medium voltage cubicles. Other problems are particularly present in medium voltage, in particular the volume occupied by known voltage presence indication devices which is liable to be incompatible with the small dimensions of the cubicles.

SUMMARY OF THE INVENTION

The object of the invention is to achieve a voltage presence indication device having a low cost, a good temperature resistance and a long lifetime.

In a device according to the invention the display means comprise at least one multilayer device comprising:
- a light-emitting layer arranged between a first and a second insulating layer,
- a first conducting layer arranged on the first insulating layer and connected to said conducting electrode, and
- a second conducting layer arranged on the second insulating layer.

In a preferred embodiment, at least said first conducting layer or said second conducting layer has at least one transparent or translucent part.

Preferably, said light-emitting layer is achieved as a thin film with a thickness of less than 2 μm.

According to an alternative embodiment, said light-emitting layer is achieved as a layer deposited in powder form.

Preferably, said second conducting layer is connected to said electrical conductor to be monitored.

According to an alternative embodiment, said second conducting layer is connected to an electrical ground.

Advantageously, at least said first conducting layer or said second conducting layer has a transparent part and an opaque part.

In a particular embodiment, at least said first conducting layer or said second conducting layer comprises a reflecting face directed towards the light-emitting layer.

Advantageously, the collector electrode and said first conducting layer form a single element.

Preferably, the conducting, insulating, and light-emitting layers are arranged on a glass substrate and protected by a protective covering.

Preferably, the collector electrode has a substantially cylindrical shape arranged around the electrical conductor to be monitored.

According to an alternative embodiment, the multilayer device is arranged on the conductor to be monitored, the second conducting layer being in contact with said conductor.

Preferably, the light-emitting electrode has a surface smaller than 1 cm$^2$ and the collector electrode has a surface comprised between 100 and 1000 cm$^2$.

Advantageously, the collector electrode is formed by a protective cap of a conductor of a high or medium voltage apparatus, the display means being arranged near to or on said protective cap.

An electrical apparatus according to the invention comprises at least one electrical conductor and a voltage presence indication device as defined above to indicate the presence of electrical voltage on said at least one electrical conductor.

In a particular embodiment, the electrical apparatus is formed by a medium voltage or high voltage cubicle.

Preferably, the shape of the collector electrode and its distance with respect to said electrical conductor or the electrical ground enables the light-emitting layer to be lit from an electrical voltage between said electrical conductor and said ground of more than 3000 V.

BRIEF DESCRIPTION OF THE DRAWINGS

Other advantages and features will become more clearly apparent from the following description of particular embodiments of the invention, given as non-restrictive examples only and represented in the accompanying drawings in which.

In certain figures, the proportions between the different elements are not respected for ease of understanding of the drawings.

DETAILED DESCRIPTION OF PREFERRED EMBODIMENTS

Figure 1:
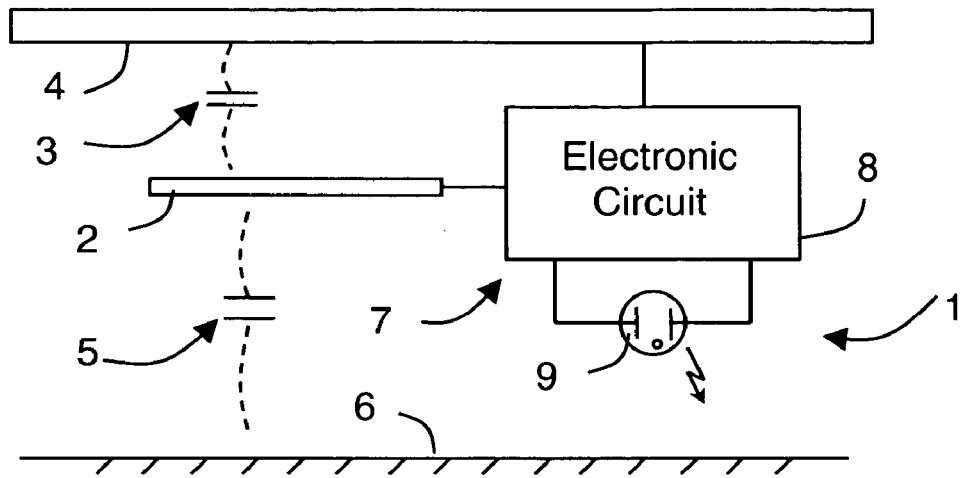
FIGS. 1 and 2 represent diagrams of voltage presence indication devices of the prior art.
Figure 2:
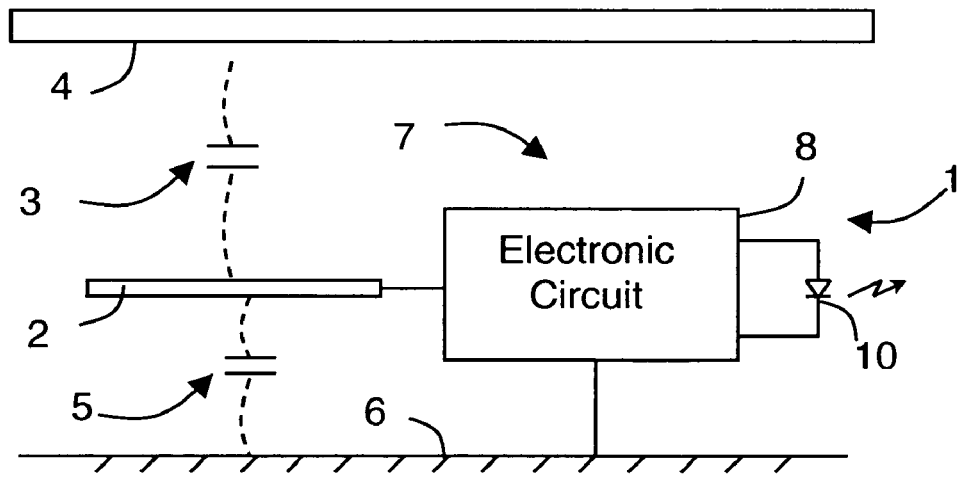
Figure 3:
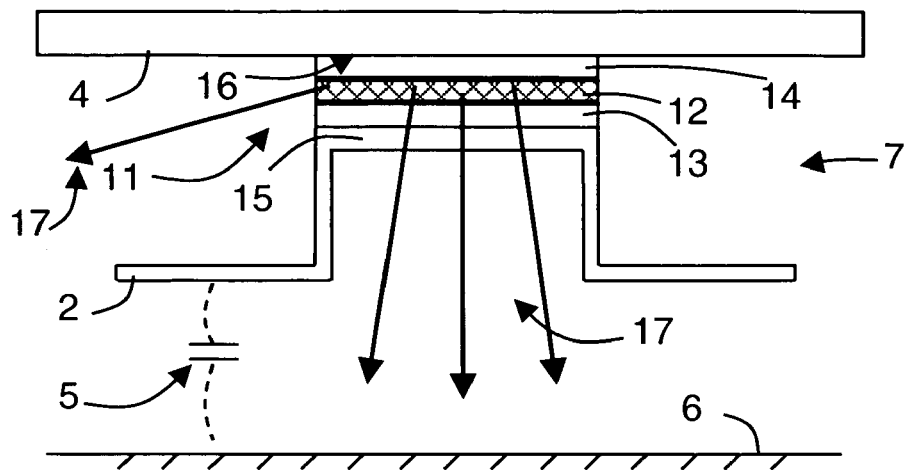
FIGS. 3, 4 and 5 represent embodiments of a device according to the invention.

In the device represented in FIG. 3 the display means 7 comprise a multilayer light-emitting device 11. This luminous device comprises a light-emitting layer 12 arranged between a first insulating layer 13 and a second insulating layer 14. A first conducting layer 15 arranged on the first insulating layer is connected to the conducting electrode 2. The layer 15 and electrode 2 can form a single element as in the drawing of FIG. 3. In this embodiment, a conducting layer 16 is arranged on the second insulating layer. This layer 16 is connected to the conductor 4, and can also be formed by a part of the conductor itself. The layer 15 has at least one translucent part to let a light 17 emitted by the light-emitting layer pass. The radiation 17 can also be emitted by the edge of the device 11 in the extension of the light-emitting layer.

When an electrical voltage increases between the conductor 4 and ground 6, the electrode 2 in capacitive connection 5 with the ground supplies electrical charges to the electrode 15. An electrical field thus forms between the two conducting electrodes 15 and 16 and in the layer 12 of light-emitting material. If the electrical field becomes sufficiently high, the light-emitting layer emits a light 17. In FIG. 3, the light passes through the insulating layer 13 and the translucent parts of the conducting layer 15.

Depending on the technology used, the light-emitting layer is achieved in the form of a thin film or in the form of a deposit of light-emitting material powder.

Advantageously, an embodiment in the form of a thin film gives a very long lifetime greater than 100,000 hours, a very good contrast, and a good temperature resistance. The light-emitting layer preferably has a thickness of less than 2 μm (micrometers), advantageously between 0.1 and 1 μm. To increase the electrical field and the lighting effect of the fluorescent layer, the insulating layers are preferably of very small thickness and have a high dielectric constant. Advantageously, the thickness of the insulating layers is less than 1 μm, for example between 300 and 500 nm (nanometers). With such dimensions the electrical field applied is very high. For example the light-emitting layer is made of a ZnS—Mn formula material of suitable dosage.

Figure 4:
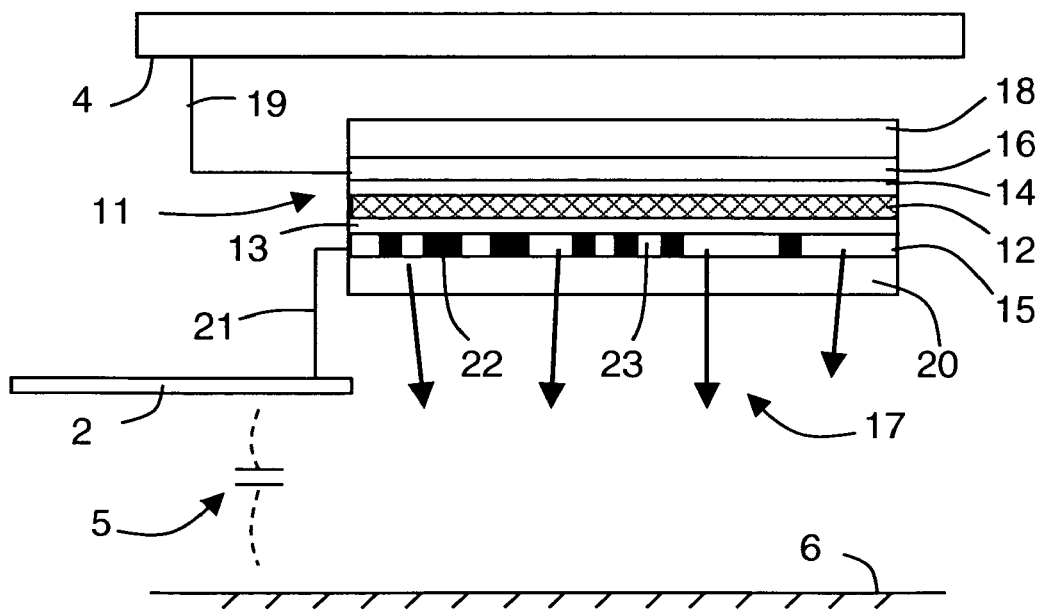

A device according to an embodiment of the invention comprising a multilayer device in thin films is represented in FIG. 4. In this figure, the multilayer 11 device respectively comprises a substrate 18 generally made of glass, a conducting layer 16 connected via a conductor 19 to the conductor 4, an insulating layer 14, a light-emitting layer 12, an insulating layer 13, a conducting layer 15 connected to the electrode 2 by a conductor 21, and a protective layer 20 generally made of glass. The layer 15 has opaque parts 22 to stop the light and translucent parts 23 to let light rays 17 emitted by the light-emitting layer pass. The conducting layers advantageously enable a substantially uniform electrical field to be had over the useful surface of the light-emitting layer.

Figure 5:
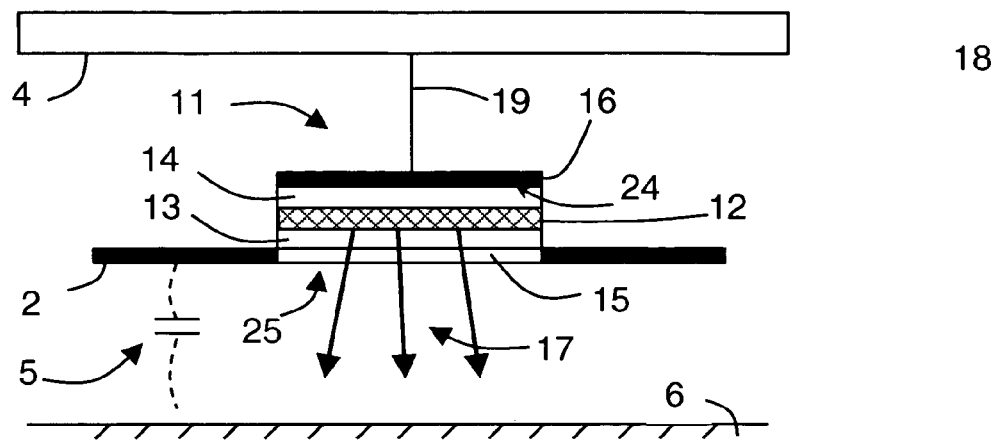

In the embodiment of FIG. 5, the conducting layer 16 has a reflecting face 24 to reflect light rays emitted by the light-emitting layer in a display direction. In this figure, the device 11 is arranged on the electrode 2 which presents an opening 25 for the light rays 17 to pass. It is also possible to fit an optic filter on the opening 25 to improve the contrast and/or to select a colour from the band emitted by the light-emitting layer.

Figure 6:
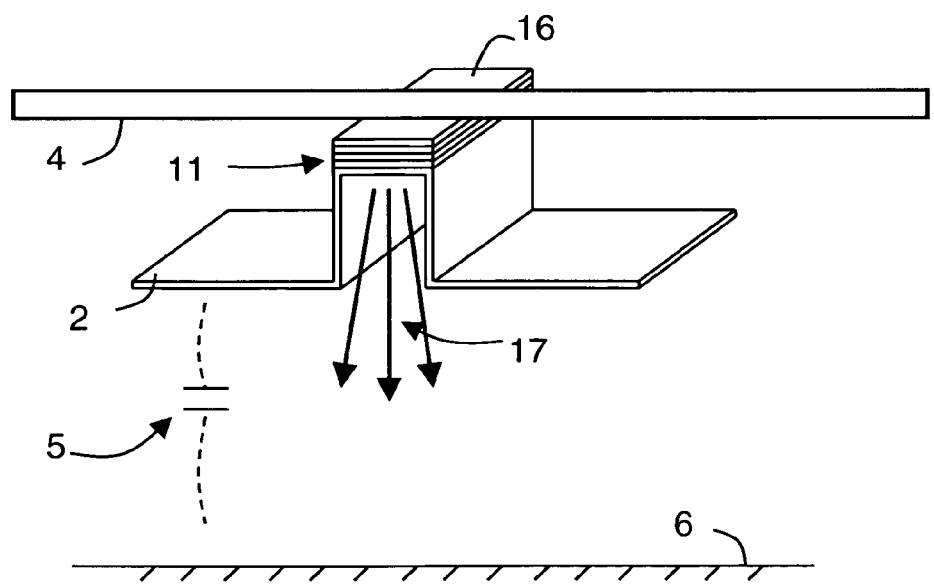
FIGS. 6 and 7 represent arrangements of a device according to embodiments of the invention.

FIG. 6 shows a particular arrangement of a device according to an embodiment of the invention. The conducting layer 16 is in contact with a conductor 4, and the electrode has an unfurled shape away from the conductor near to the ground.

Figure 7:
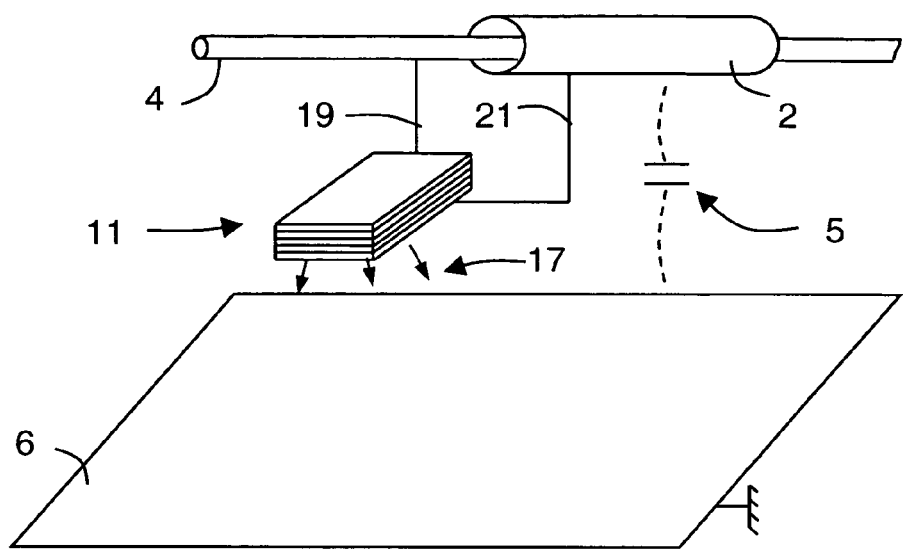

In FIG. 7, the collector electrode 2 is of cylindrical shape surrounding the conductor 4 and in capacitive connection 5 with the ground 6. The multilayer device 11 has a conducting layer 16 connected to the conductor 4 and a conducting layer 15 connected to the electrode 2.

Figure 8:
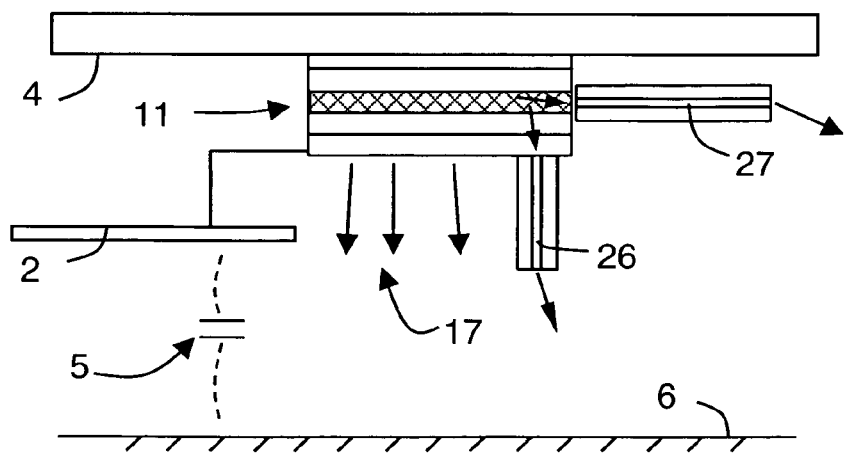
FIG. 8 represents an embodiment of a device according to the invention associated to optical ducts.

In the embodiment of FIG. 8, the multilayer device is associated to optical ducts 26 or 27 arranged respectively on a face or on a side. These ducts enable a light flow emitted by the light-emitting layer to be conducted to accessible display points or to remote processing devices. These ducts can in particular be optic fibers or other ducts made of suitable material.

Figure 9:
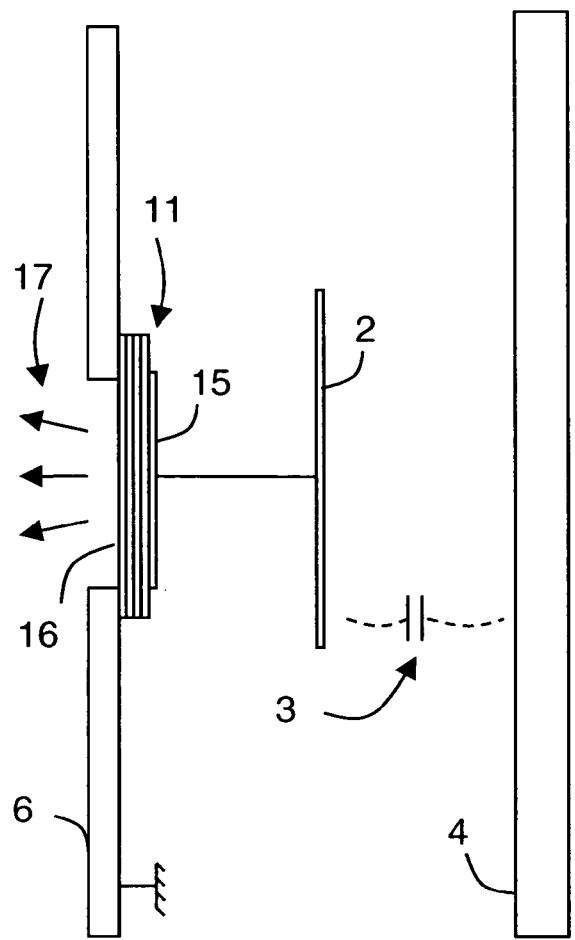
FIGS. 9, 10 and 11 represent a device according to an embodiment of the invention in an electrical apparatus.

FIG. 9 shows an embodiment where the multilayer device is at the potential of the ground 6. The ground 6 can be notably a wall or a front panel of an electrical apparatus such as a cubicle or cabinet. In this case, the first conducting layer 15 is connected to the collector electrode 2 in capacitive connection 3 with the conductor 4 to be monitored. The second conducting electrode 16 is connected to the ground 6 and presents a translucent part to let light rays 17 emitted by the light-emitting layer pass.

Figure 10:
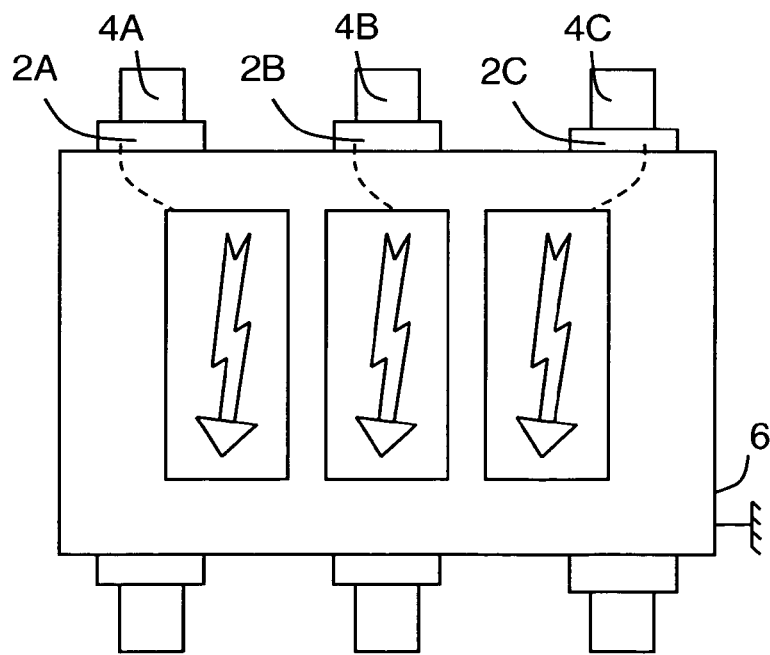

In an embodiment where the second electrode is grounded, a multilayer device 11 can have a first conducting layer in several separate parts, for example to monitor three phases like the device represented in FIG. 10. In this device, three separate parts of a first conducting layer 15 are connected to three collector electrodes 2A, 2B, 2C in capacitive connection with three conductors respectively 4A, 4B and 4C. In this figure, patterns are arranged on visual parts of the device. These patterns can also be visualized according to the shape of the conducting or light-emitting layers.

Figure 11:
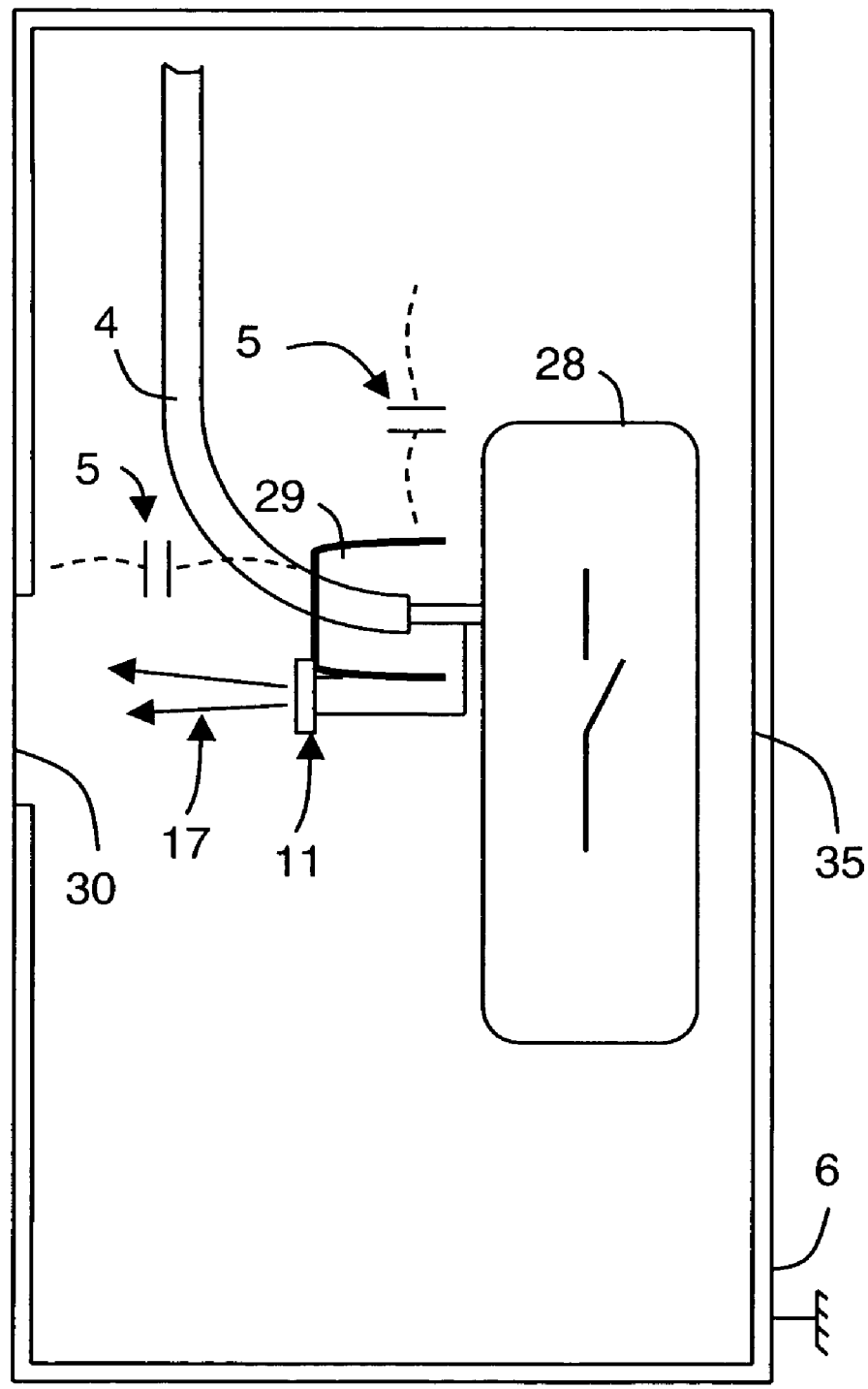

FIG. 11 shows an electrical apparatus such as a medium voltage cubicle 35 comprising a device according to an embodiment of the invention. This apparatus comprises a switchgear device 28 receiving an electrical conductor 4 and a cap 29 protecting the conductor against electrical flashovers on output from an insulator of said conductor. In this embodiment, the metal cap 29 is advantageously also used as collector electrode. In this embodiment, the multilayer device is arranged near or on said cap. The first conducting electrode is connected to the cap 28 acting as collector electrode, and the second conducting electrode is connected to the conductor 4 on output from its insulator or on an output terminal to which the conductor is connected. The cap is in capacitive connection 5 with the electrical ground 6 of the cubicle 35. The light rays are directed to an opening of the cubicle or to a display window 30. An electrical apparatus according to the invention can also be a switchgear device 28 such as a switch or circuit breaker comprising a conductor or an output acting as conductor 4 to be monitored. In this case, an electrode 2 and a multilayer device 11 can be arranged on the apparatus.

Figure 12:
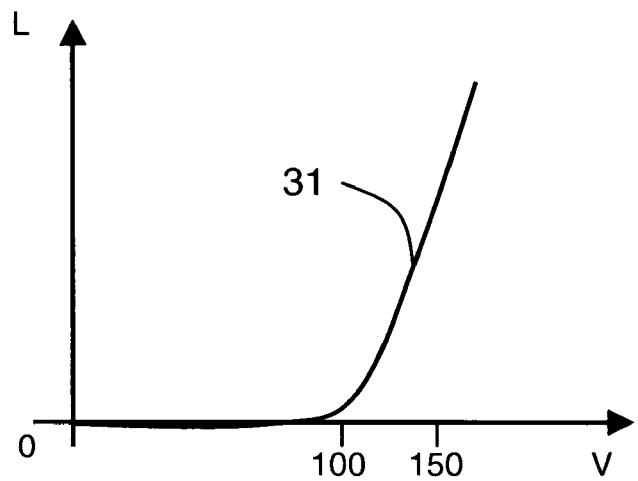
FIG. 12 represents a luminescence curve of a device according to the invention as a function of an electrical voltage between conducting layers.

FIG. 12 shows an example of a luminosity curve 31 of a multilayer device. A lighting starting threshold is around 100V. Above this threshold, the luminosity increases when the voltage increases.

Figure 13:
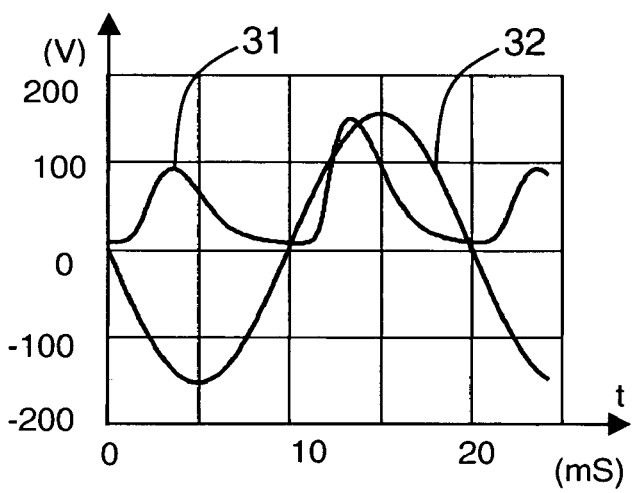
FIG. 13 represents a luminescence curve of a light-emitting layer as a function of an AC electrical voltage between conducting layers.

FIG. 13 shows another example of a luminosity curve of a multilayer device in AC voltage represented by a curve 32.

Figure 14:
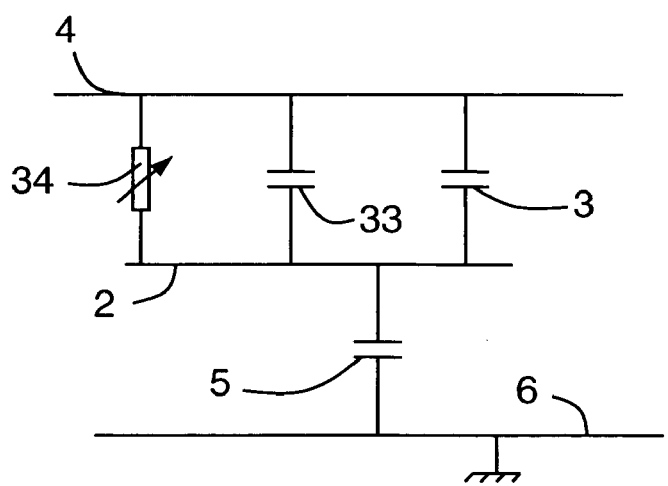
FIG. 14 represents an electrical modeling of a device according to an embodiment of the invention.

FIG. 14 shows an electrical modeling of a device according to an embodiment of the invention. The first capacitive connection is represented by a capacitor between the conductor 4 and collector electrode 2, and the second capacitive connection is represented by a capacitor 5 between the collector electrode 2 and ground 6. The multilayer device is represented by a capacitor 33 representing the conducting layers 15 and 16 separated by insulating layers 13 and 14, and by a resistance 34 variable according to the voltage representing the non-linear behavior of the light-emitting layer. In this embodiment, the capacitor 33 has a higher capacitance than that of the capacitor 3, and the capacitor 3 has a higher capacitance than that of the capacitor 5. The values of the elements depend on the geometry and distances between said elements.

The collector electrode preferably has a surface comprised between 100 and 1000 cm$^2$ (square centimeters). When the multilayer device is near the conductor 4, the distance between the collector electrode and ground can for example be between 10 cm and 1 m depending on the rated voltage of the conductor to be monitored.

In the embodiments described above the capacitive connections with the collector electrode are made between a conductor and ground. But it is possible in other embodiments of the invention to make capacitive connections between two active conductors, for example to monitor the voltage between two phase conductors.

The devices according to the invention are particularly well suited for medium or high AC voltages. They can however be used for other values.

The devices according to the invention enable capacitor insulators to be avoided for capacitive connections. But they can also be used with such components while remaining within the scope of the invention, in particular when a very strong luminosity is sought for.

Likewise, devices according to the invention enable electronic circuitry to be avoided. But electronic circuits can also be associated to devices according to the invention, in particular to perform additional functions such as for example flashing of the light flow or remote information display.

The invention claimed is:

1. A voltage presence indication device comprising:
    a collector electrode designed to have at least one capacitive link with an electrical ground or a capacitive link with an electrical conductor to be monitored; and
    a display means connected to said collector electrode to indicate the presence of an electrical voltage in said electrical conductor to be monitored;
    said display means comprising at least one multilayer device comprising:
    a light-emitting layer arranged between a first and a second insulating layer;
    a first conducting layer arranged on the first insulating layer and connected to said collector electrode; and
    a second conducting layer arranged on the second insulating layer;
    said display means further comprising at least one of the following:
    (i) the first conducting layer is directly electrically connected to the collector electrode, or (ii) the second conducting layer is directly electrically connected to the electrical conductor, or (iii) the second conducting layer is directly electrically connected to an electrical ground.

2. Device according to claim 1 wherein at least said first conducting layer or said second conducting layer has at least one transparent or translucent part.

3. Device according to claim 1 wherein said light-emitting layer comprises a thin film having a thickness of less than 2 µm.

4. Device according to claim 1 wherein said light-emitting layer comprises a layer deposited in powder form.

5. Device according to claim 1 wherein said second conducting layer is connected to said electrical conductor to be monitored.

6. Device according to claim 1 wherein said second conducting layer is connected to an electrical ground.

7. Device according to claim 1 wherein at least said first conducting layer or said second conducting layer has a transparent part and an opaque part.

8. Device according to claim 1 wherein at least said first conducting layer or said second conducting layer comprises a reflecting face directed towards the light-emitting layer.

9. Device according to claim 1 wherein the collector electrode and said first conducting layer form a single element.

10. Device according to claim 1 wherein the conducting, insulating, and light-emitting layers are arranged on a glass substrate and protected by a protective covering.

11. Device according to claim 1 wherein the collector electrode has a substantially cylindrical shape arranged around the electrical conductor to be monitored.

12. Device according to claim 1 wherein the multilayer device is arranged on the electrical conductor to be monitored, the second conducting layer being in contact with said electrical conductor.

13. Device according to claim 1 wherein the collector electrode has a surface smaller than 1 cm$^2$ and the collector electrode has a surface comprised between 100 and 1000 cm$^2$.

14. Device according to claim 1 wherein the collector electrode is formed by a protective cap of a conductor of a high or medium voltage apparatus, the display means being arranged near to or on said protective cap.

15. Electrical apparatus comprising at least one electrical conductor comprising a voltage presence indication device according to claim 1 to indicate the presence of electrical voltage on said at least one electrical conductor.

16. Electrical apparatus according to claim 15 formed by a medium voltage or high voltage cubicle.

17. Electrical apparatus according to claim 16 wherein the shape of the collector electrode and its distance with respect to said electrical conductor or the electrical ground enables the light-emitting layer to be lit from an electrical voltage between said electrical conductor and said ground of more than 3000 V.

18. The electrical apparatus according to claim 1, wherein the first conducting layer is directly electrically connected to the collector electrode, and the second conducting layer is directly electrically connected to the electrical conductor.

* * * * *